(12) United States Patent
Sigetani et al.

(10) Patent No.: US 9,312,853 B2
(45) Date of Patent: Apr. 12, 2016

(54) HIGH FREQUENCY SEMICONDUCTOR SWITCH CIRCUIT AND HIGH FREQUENCY RADIO SYSTEM INCLUDING SAME

(71) Applicant: PANASONIC INTELLECTUAL PROPERTY MANAGEMENT CO., LTD., Osaka (JP)

(72) Inventors: Atusi Sigetani, Osaka (JP); Takahito Miyazaki, Kyoto (JP); Yusuke Nozaki, Osaka (JP); Masaru Fukusen, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/612,195

(22) Filed: Feb. 2, 2015

(65) Prior Publication Data

US 2015/0145587 A1    May 28, 2015

Related U.S. Application Data

(63) Continuation of application No. PCT/JP2013/001406, filed on Mar. 6, 2013.

(30) Foreign Application Priority Data

Aug. 9, 2012    (JP) ................................ 2012-176986

(51) Int. Cl.
*H03K 17/693*    (2006.01)
*H04B 1/48*    (2006.01)
(Continued)

(52) U.S. Cl.
CPC ............ *H03K 17/689* (2013.01); *H03K 17/162* (2013.01); *H03K 17/6877* (2013.01); *H03K 17/693* (2013.01); *H04B 1/48* (2013.01); *H03K 2017/066* (2013.01); *H03K 2217/0054* (2013.01)

(58) Field of Classification Search
CPC ............ H03K 17/162; H03K 17/6877; H03K 17/689; H03K 17/693; H03K 2017/066; H03K 2217/0054; H04B 1/48
See application file for complete search history.

(56) References Cited

U.S. PATENT DOCUMENTS

| | | | |
|---|---|---|---|
| 5,903,178 A | 5/1999 | Miyatsuji et al. | |
| 7,199,635 B2 * | 4/2007 | Nakatsuka | H03K 17/102 327/308 |

(Continued)

FOREIGN PATENT DOCUMENTS

| | | |
|---|---|---|
| JP | 06-085641 A | 3/1994 |
| JP | 08-228138 A | 9/1996 |

(Continued)

OTHER PUBLICATIONS

International Search Report issued in International Application No. PCT/JP2013/001406 with Date of mailing Apr. 23, 2013, with English Translation.

*Primary Examiner* — Patrick O'Neill
(74) *Attorney, Agent, or Firm* — McDermott Will & Emery LLP

(57) ABSTRACT

A path switching FET and a shunt FET are separated from each other by a capacitor. The gates of the path switching FET and the shunt FET are controlled using an inverter circuit having a first internal power supply voltage (e.g., 2.5 V) as a power supply. The sources and drains of the path switching FET and the shunt FET are controlled using an inverter circuit having a second internal power supply voltage (e.g., 1.25 V) which is smaller than the first internal power supply voltage, as a power supply.

7 Claims, 7 Drawing Sheets

(51) Int. Cl.
*H03K 17/16* (2006.01)
*H03K 17/689* (2006.01)
*H03K 17/687* (2006.01)
*H03K 17/06* (2006.01)

(56) References Cited

U.S. PATENT DOCUMENTS 8,729,952 B2 * 5/2014 Yang .................. H03K 17/162 327/434
8,854,111 B2 * 10/2014 Chih-Sheng ......... H03K 17/693 327/407
9,231,578 B2 * 1/2016 Chih-Sheng ......... H03K 17/007
2013/0127495 A1 5/2013 Miyazaki

FOREIGN PATENT DOCUMENTS

| JP | 2001-217653 A | 8/2001 |
| JP | 2006-121217 A | 5/2006 |
| JP | 2008-109591 A | 5/2008 |
| JP | 2012-114729 A | 6/2012 |

* cited by examiner

FIG.3

| ON/OFF OF EACH PATH | | CONTROL VOLTAGE | | VOLTAGE APPLIED TO FET | | | | | | | |
|---|---|---|---|---|---|---|---|---|---|---|---|
| | | | | FET121 | | FET122 | | FET123 | | FET124 | |
| 101-102 | 101-103 | 301 | 302 | GATE | SOURCE/DRAIN | GATE | SOURCE/DRAIN | GATE | SOURCE/DRAIN | GATE | SOURCE/DRAIN |
| ON | OFF | High | Low | High | Low | Low | Mid | Low | Mid | High | Low |
| OFF | ON | Low | High | Low | Mid | High | Low | High | Low | Low | Mid |
| OFF | OFF | Low | Low | Low | Mid | Low | Mid | High | Low | High | Low |
| ON | ON | High | High | High | Low | High | Low | Low | Mid | Low | Mid |

HIGH FREQUENCY SEMICONDUCTOR SWITCH CIRCUIT AND HIGH FREQUENCY RADIO SYSTEM INCLUDING SAME

CROSS-REFERENCE TO RELATED APPLICATIONS

This is a continuation of International Application No. PCT/JP2013/001406 filed on Mar. 6, 2013, which claims priority to Japanese Patent Application No. 2012-176986 filed on Aug. 9, 2012. The entire disclosures of these applications are incorporated by reference herein.

BACKGROUND

The present disclosure relates to high-frequency semiconductor switch circuits for use in radio communication apparatuses having a small size, light weight, and low power consumption, such as a mobile telephone, etc., and high-frequency radio systems including such a high-frequency semiconductor switch circuit.

Mobile communication apparatuses, typified by a mobile telephone, require a high-frequency semiconductor switch circuit having a small size and low power consumption in order to switch high-frequency signal transmission paths, e.g., switch the antenna between transmission and reception. For example, such a high-frequency semiconductor switch circuit may include a gallium arsenide field effect transistor (GaAsFET), which has good high-frequency characteristics and low power consumption, as a switching element.

In recent years, highly-insulating semiconductor substrates, typified by a silicon-on-sapphire (SOS) substrate and a silicon-on-insulator (SOI) substrate, have been much improved. A technology of using a metal oxide semiconductor field effect transistor (MOSFET), which is less suitable for a high-frequency semiconductor switch circuit, as a switching element for switching paths, has also been developed.

Specifically, known is a high-frequency semiconductor switch circuit in which a path switching FET is provided between a common input/output terminal and each of a plurality of separate input/output terminals. However, the use of only single path switching FETs in a high-frequency semiconductor switch circuit causes a problem that it is difficult to improve isolation characteristics without an increase in insertion loss.

Therefore, in Japanese Unexamined Patent Publication Nos. H06-85641 and 2008-109591, a path switching FET is used in combination with a shunt FET. However, there is a problem that the path switching FET and the shunt FET cannot be separately controlled, and therefore, the isolation of a FET in the off state is poor.

In contrast to this, in Japanese Unexamined Patent Publication No. 2012-114729, a path switching FET and a shunt FET are separated from each other by a capacitor, and therefore, can be controlled using separate voltages.

However, in Japanese Unexamined Patent Publication No. 2012-114729 above, the gate, source, and drain of each of the path switching FET and the shunt FET are controlled using a high voltage (e.g., 2.5 V) or a low voltage (0 V). Therefore, when a large amplitude signal (e.g., 2 Vpp) is input to the common input/output terminal, the voltage of a FET in the off state ranges from 1.5 V to 3.5 V, where the center is 2.5 V, and therefore, the breakdown voltage (e.g., a maximum rated voltage of 2.7 V) is exceeded. Therefore, it is necessary to put a limit on the amplitude of an RF signal input to the common input/output terminal or use a FET having a higher breakdown voltage instead. However, there are the following problems: the limitation of the amplitude of the input RF signal leads to a failure to satisfy the desired characteristics; and the use of a FET having a higher breakdown voltage leads to an increase in insertion loss and an increase in chip size.

SUMMARY

The present disclosure describes implementations of a high-frequency semiconductor switch circuit which solves the above problems, i.e., the increase in chip size and the degradation in insertion loss in an on-state path, and is not limited by the breakdown voltage of a FET.

The present disclosure also describes implementations of a high-frequency semiconductor switch circuit which ensures isolation in multiband applications to provide high performance.

An example high-frequency semiconductor switch circuit according to the present disclosure includes one common input/output terminal, two or more separate input/output terminals, and two or more control terminals corresponding to the separate input/output terminals, two or more path switching FET blocks, one block being provided between the common input/output terminal and each of the two or more separate input/output terminals, one or more shunt FET blocks, one block being provided between the ground and each of at least one of the two or more separate input/output terminals, a direct-current blocking capacitor provided at both ends of each of the two or more path switching FET blocks, a direct-current blocking capacitor provided at both ends of each of the one or more shunt FET blocks, and a source bias resistor provided for each of the two or more path switching FET blocks and for each of the one or more shunt FET blocks. A control voltage input to each of the two or more control terminals is applied to the gate of a corresponding one of the two or more path switching FET blocks so that at least one of high-frequency signal paths between the common input/output terminal and the respective separate input/output terminals is caused to be in the conducting state while the other high-frequency signal paths are caused to be in the non-conducting state. A control voltage which is an inverted version of a voltage input to each of the two or more control terminals is applied to the gate of a corresponding one of the one or more shunt FET blocks. A control voltage which has an inverted polarity and a smaller absolute value compared to a voltage input to each of the two or more control terminals, is applied to the source or drain of a corresponding one of the two or more path switching FET blocks. A control voltage which has a non-inverted polarity and a smaller absolute value compared to a voltage input to each of the two or more control terminals, is applied to the source or drain of a corresponding one of the one or more shunt FET blocks.

According to the present disclosure, a high-performance high-frequency semiconductor switch circuit can be provided which has a small size and low power consumption, and has a high breakdown voltage while maintaining good characteristics, such as low insertion loss and high isolation.

BRIEF DESCRIPTION OF THE DRAWINGS

FIG. 3 is a diagram showing a control logic table for the high-frequency semiconductor switch circuit of FIG. 1.

DETAILED DESCRIPTION

Figure 1:
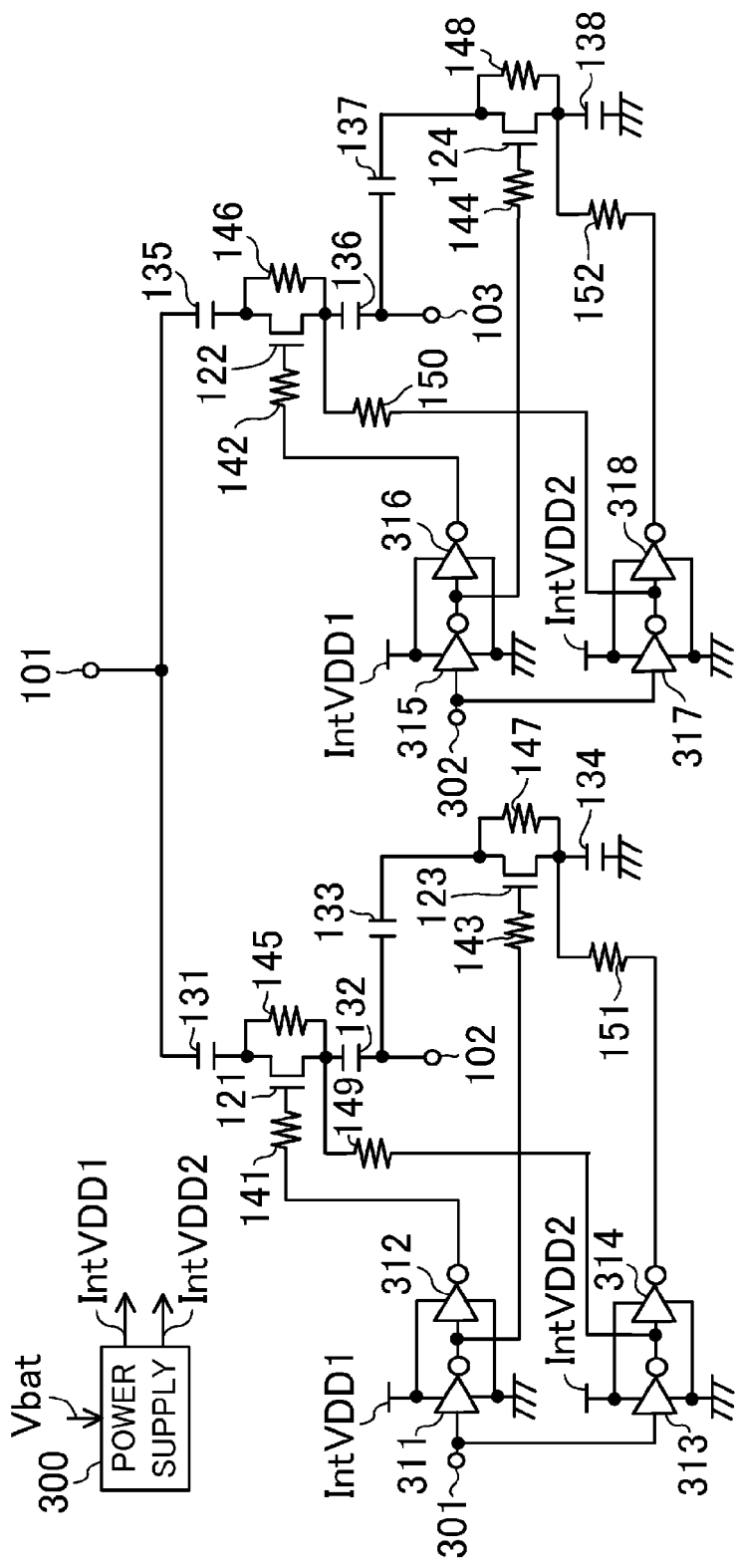
FIG. 1 is a circuit diagram showing an example configuration of a high-frequency semiconductor switch circuit according to a first embodiment of the present disclosure.

Preferred embodiments of the present disclosure will now be described with reference to the accompanying drawings. Note that like parts are designated by like reference characters throughout the drawings, and may not be redundantly described.

First Embodiment

FIG. 1 is a circuit diagram showing an example configuration of a high-frequency semiconductor switch circuit according to a first embodiment of the present disclosure. The high-frequency semiconductor switch circuit of FIG. 1 includes a common input/output terminal 101, and two separate input/output terminals 102 and 103. A series circuit including a direct-current blocking capacitor 131, a path switching FET 121, and a direct-current blocking capacitor 132 is connected between the common input/output terminal 101 and one (102) of the separate input/output terminals. A series circuit including a direct-current blocking capacitor 135, a path switching FET 122, and a direct-current blocking capacitor 136 is connected between the common input/output terminal 101 and the other separate input/output terminal (103). By turning on or off each of the path switching FETs 121 and 122, signal paths between the common input/output terminal 101 and the separate input/output terminals 102 and 103, can be switched.

The path switching FETs 121 and 122 are each a MOSFET. A voltage which is needed to turn on or off the path switching FET 121 is applied to the gate of the path switching FET 121 through a gate bias resistor 141. A voltage which is needed to turn on or off the path switching FET 122 is applied to the gate of the path switching FET 122 through a gate bias resistor 142.

A series circuit including a direct-current blocking capacitor 133, a shunt FET 123, and a direct-current blocking capacitor 134 is connected between the separate input/output terminal 102 and the ground. A series circuit including a direct-current blocking capacitor 137, a shunt FET 124, and a direct-current blocking capacitor 138 is connected between the separate input/output terminal 103 and the ground.

The shunt FETs 123 and 124 are each a MOSFET. A voltage which is needed to turn on or off the shunt FET 123 is applied to the gate of the shunt FET 123 through a gate bias resistor 143. A voltage which is needed to turn on or off the shunt FET 124 is applied to the gate of the shunt FET 124 through a gate bias resistor 144. The shunt FETs 123 and 124 are turned on or off with voltage polarities opposite to those for the path switching FETs 121 and 122, respectively, whereby high isolation characteristics can be achieved.

A voltage is applied to the source of the path switching FET 121 through a source bias resistor 149. A voltage is applied to the source of the path switching FET 122 through a source bias resistor 150. The source voltages applied to the path switching FET 121 and the path switching FET 122 have opposite polarities. A voltage is applied to the source of the shunt FET 123 through a source bias resistor 151. A voltage is applied to the source of the shunt FET 124 through a source bias resistor 152. The source voltages applied to the shunt FET 123 and the shunt FET 124 have opposite polarities. As described above, the gate and source voltages of the FETs 121, 122, 123, and 124 can be separately controlled.

Source-drain short-circuit resistors 145, 146, 147, and 148 are connected between the sources and drains of the FETs 121, 122, 123, and 124, respectively, so that the sources and drains of the FETs 121, 122, 123, and 124 have the same potential. Note that at least one of the source-drain short-circuit resistors 145, 146, 147, and 148 may be removed.

In the high-frequency semiconductor switch circuit of FIG. 1, a power supply circuit 300, control terminals 301 and 302, and inverter circuits 311-318 are used to supply gate and source voltages to the FETs 121, 122, 123, and 124.

Specifically, a voltage which is needed to turn on or off the path switching FET 121 is applied from the control terminal 301 to the gate of the path switching FET 121 through a cascade of the two inverter circuits 311 and 312 and the gate bias resistor 141. A voltage which is needed to turn on or off the path switching FET 122 is applied from the control terminal 302 to the gate of the path switching FET 122 through a cascade of two inverter circuits 315 and 316 and the gate bias resistor 142. A voltage which is needed to turn on or off the shunt FET 123 is applied from the control terminal 301 to the gate of the shunt FET 123 through the single inverter circuit 311 and the gate bias resistor 143. A voltage which is needed to turn on or off the shunt FET 124 is applied from the control terminal 302 to the gate of the shunt FET 124 through the single inverter circuit 315 and the gate bias resistor 144. A voltage is applied from the control terminal 301 to the source of the path switching FET 121 through the single inverter circuit 313 and the source bias resistor 149. A voltage is applied from the control terminal 302 to the source of the path switching FET 122 through the single inverter circuit 317 and the source bias resistor 150. A voltage is applied from the control terminal 301 to the source of the shunt FET 123 through the cascade of the inverter circuits 313 and 314 and the source bias resistor 151. A voltage is applied from the control terminal 302 to the source of the shunt FET 124 through a cascade of the two inverter circuits 317 and 318 and the source bias resistor 152.

The power supply circuit 300 supplies power to the inverter circuits 311-318. A first internal power supply voltage IntVDD1 is supplied to the inverter circuits 311, 312, 315, and 316 connected to the gates of the respective FETs. A second internal power supply voltage IntVDD2 is supplied to the inverter circuits 313, 314, 317, and 318 connected to the sources of the respective FETs. Here, IntVDD1 is greater than IntVDD2, e.g., IntVDD1 is 2.5 V and IntVDD2 is 1.25 V. For example, IntVDD1 and IntVDD2 are generated by the power supply circuit 300 based on an input voltage Vbat from a battery.

Figure 2:
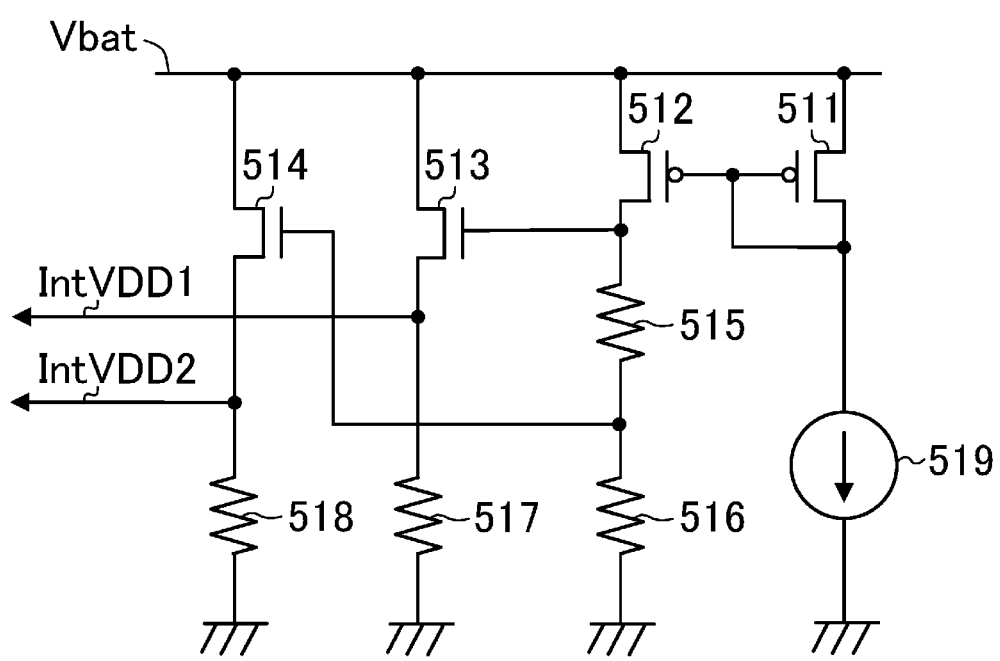
FIG. 2 is a circuit diagram showing an example configuration of a power supply circuit of FIG. 1.

FIG. 2 is a circuit diagram showing an example configuration of the power supply circuit 300. The power supply circuit 300 of FIG. 2 includes PMOSFETs 511 and 512, NMOSFETs 513 and 514, resistors 515-518, and a current source 519.

A current generated by the current source 519 is supplied to the PMOSFET 511 whose drain and gate are connected together. The gates of the PMOSFETs 511 and 512 are connected together, and the sources of the PMOSFETs 511 and 512 are connected to the input voltage Vbat of the power supply circuit 300. A series circuit including the resistors 515 and 516 is inserted between the drain of the PMOSFET 512 and the ground. A connection point between the resistor 515 and the PMOSFET 512 is connected to the gate of the NMOSFET 513. A connection point between the resistors 515 and 516 is connected to the gate of the NMOSFET 514. The resistor 517 is inserted between the source of the NMOSFET 513 and the ground. The resistor 518 is inserted between the source of the NMOSFET 514 and the ground. A connection point between the NMOSFET 513 and the resistor 517 serves as one output, and a voltage at the connection point is IntVDD1. A connection point between the NMOSFET 514 and the resistor 518 serves as the other output, and a voltage at the connection point is IntVDD2. By using such a circuit configuration, two potentials having different levels, i.e., IntVDD1 and IntVDD2, can be easily generated.

FIG. 3 is a diagram showing a control logic table for the high-frequency semiconductor switch circuit of FIG. 1. FIG. 3 shows four cases. Here, the case in the fourth row from the bottom will be described. Specifically, it is assumed that a high-frequency signal path between the common input/output terminal 101 and the separate input/output terminal 102 is caused to be in the conducting state, and a high-frequency signal path between the common input/output terminal 101 and the separate input/output terminal 103 is caused to be in the non-conducting state. In the description that follows, a middle potential between the high level and the low level is referred to as a "mid-level."

Voltage levels shown in the control logic table of FIG. 3 are supplied to the control terminals. Specifically, the high level is supplied to the control terminal 301, and the low level is supplied to the control terminal 302. In this case, the gate voltage of the path switching FET 121 goes to the high level, e.g., 2.5 V, and the source and drain voltages of the path switching FET 121 go to the low level, e.g., 0 V, and therefore, the path switching FET 121 is turned on. The gate voltage of the path switching FET 122 goes to the low level, e.g., 0 V, and the source and drain voltages of the path switching FET 122 go to the mid-level, e.g., 1.25 V, and therefore, the path switching FET 122 is turned off. The gate voltage of the shunt FET 123 goes to the low level, e.g., 0 V, and the source and drain voltages of the shunt FET 123 go to the mid-level, e.g., 1.25 V, and therefore, the shunt FET 123 is turned off. The gate voltage of the shunt FET 124 goes to the high level, e.g., 2.5 V, and the source and drain voltages of the shunt FET 124 go to the low level, e.g., 0 V, and therefore, the shunt FET 124 is turned on. As a result, a signal is transmitted from the common input/output terminal 101 to the separate input/output terminal 102, and a signal is not transmitted from the common input/output terminal 101 to the separate input/output terminal 103. Thus, an on/off control can be reliably performed, and therefore, leakage to a signal path in the off state is reduced, whereby a high-frequency semiconductor switch circuit having good characteristics, such as high isolation and low distortion, can be provided.

The source and drain voltages of the path switching FET 122 and the shunt FET 123 in the off state are caused to be at the mid-level, whereby even when a large amplitude signal is input to the common input/output terminal 101, the breakdown voltages of the path switching FET 122 and the shunt FET 123 are not exceeded. Specifically, when a high-frequency signal of 2 Vpp (the absolute values of the highest and lowest amplitudes are both 1 V) is input to the common input/output terminal 101, the maximum voltages applied to the sources of the path switching FET 122 and the shunt FET 123 are 1.25 V+1 V. When the breakdown voltages of the path switching FET 122 and the shunt FET 123 are, for example, 2.7 V, the breakdown voltages are not exceeded, and therefore, the FETs 122 and 123 operate normally.

As described above, in the high-frequency semiconductor switch circuit of this embodiment, both low insertion loss and high isolation characteristics can be achieved, and the chip size can be reduced. By using the power supply circuit 300 and the inverter circuits 311-318, the high-frequency semiconductor switch circuit of this embodiment can be easily implemented on a single chip.

Note that the inverter circuits 311-318 are assumed to be a typical inverter circuit which includes a PMOSFET and an NMOSFET in order to reduce the power consumption and chip size. Alternatively, any other circuits that have similar functionality can be employed. Although, in FIG. 1, two inverter circuits are connected together in cascade, the number, connection pattern, and types of inverter circuits are not limited if a similar logic can be achieved.

This embodiment is not limited to the high-frequency semiconductor switch circuit which has the two separate input/output terminals 102 and 103, and may be changed to provide a high-frequency semiconductor switch circuit having three or more separate input/output terminals.

Figure 4:
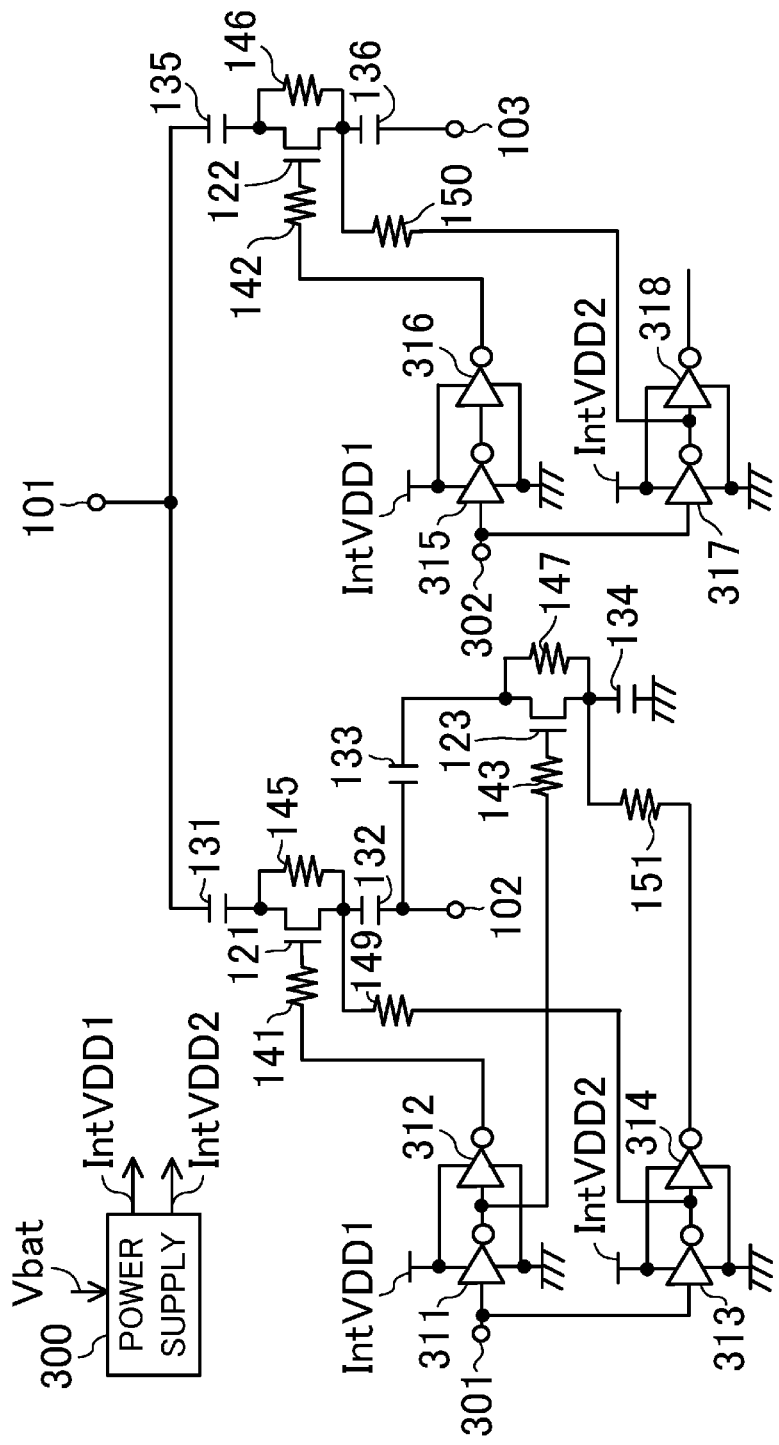
FIG. 4 is a circuit diagram showing a first variation of the high-frequency semiconductor switch circuit of FIG. 1.

FIG. 4 is a circuit diagram showing a first variation of the high-frequency semiconductor switch circuit of FIG. 1. In the high-frequency semiconductor switch circuit of FIG. 4, the shunt FET 123 for ensuring isolation is connected to only one of the high-frequency signal paths in FIG. 1. Specifically, although, in FIG. 1, the shunt FETs 123 and 124 are connected to the respective high-frequency signal paths, this embodiment is applicable to a case where, as shown in FIG. 4, the shunt FET 123 is connected to only a particular high-frequency signal path.

Figure 5:
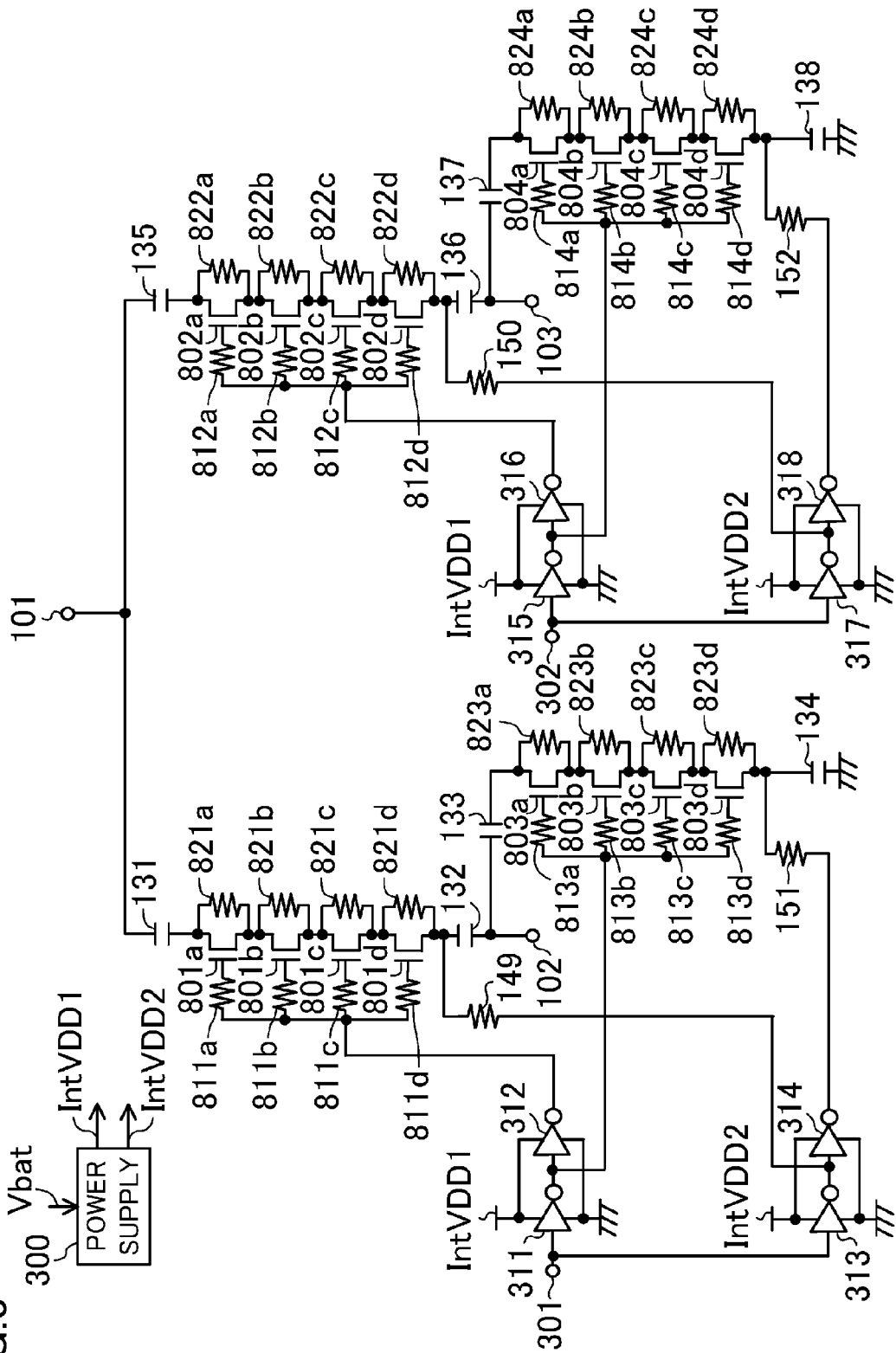
FIG. 5 is a circuit diagram showing a second variation of the high-frequency semiconductor switch circuit of FIG. 1.

FIG. 5 is a circuit diagram showing a second variation of the high-frequency semiconductor switch circuit of FIG. 1. The high-frequency semiconductor switch circuit of FIG. 5 includes a path switching FET block including four path switching FETs 801a-801d connected together in series, and another path switching FET block including four path switching FETs 802a-802d connected together in series. Reference characters 811a-811d indicate a gate bias resistor. Reference characters 821a-821d indicate a source-drain short-circuit resistor. Reference characters 812a-812d indicate a gate bias resistor. Reference characters 822a-822d indicate a source-drain short-circuit resistor. The high-frequency semiconductor switch circuit of FIG. 5 also includes a shunt FET block including four shunt FETs 803a-803d connected together in series, and another shunt FET block including four shunt FETs 804a-804d connected together in series. Reference characters 813a-813d indicate a gate bias resistor. Reference characters 823a-823d indicate a source-drain short-circuit resistor. Reference characters 814a-814d indicate a gate bias resistor. Reference characters 824a-824d indicate a source-drain short-circuit resistor. Although FIG. 1 shows the case where a path switching FET block and a shunt FET block provided in each high-frequency signal path each include a single MOSFET, this embodiment is applicable to the case where two or more MOSFETs are connected together in series. Thus, by providing a path switching FET block and a shunt FET block each including a plurality of MOSFETs connected together in series, the isolation characteristics or breakdown voltage can be improved.

Second Embodiment

Figure 6:
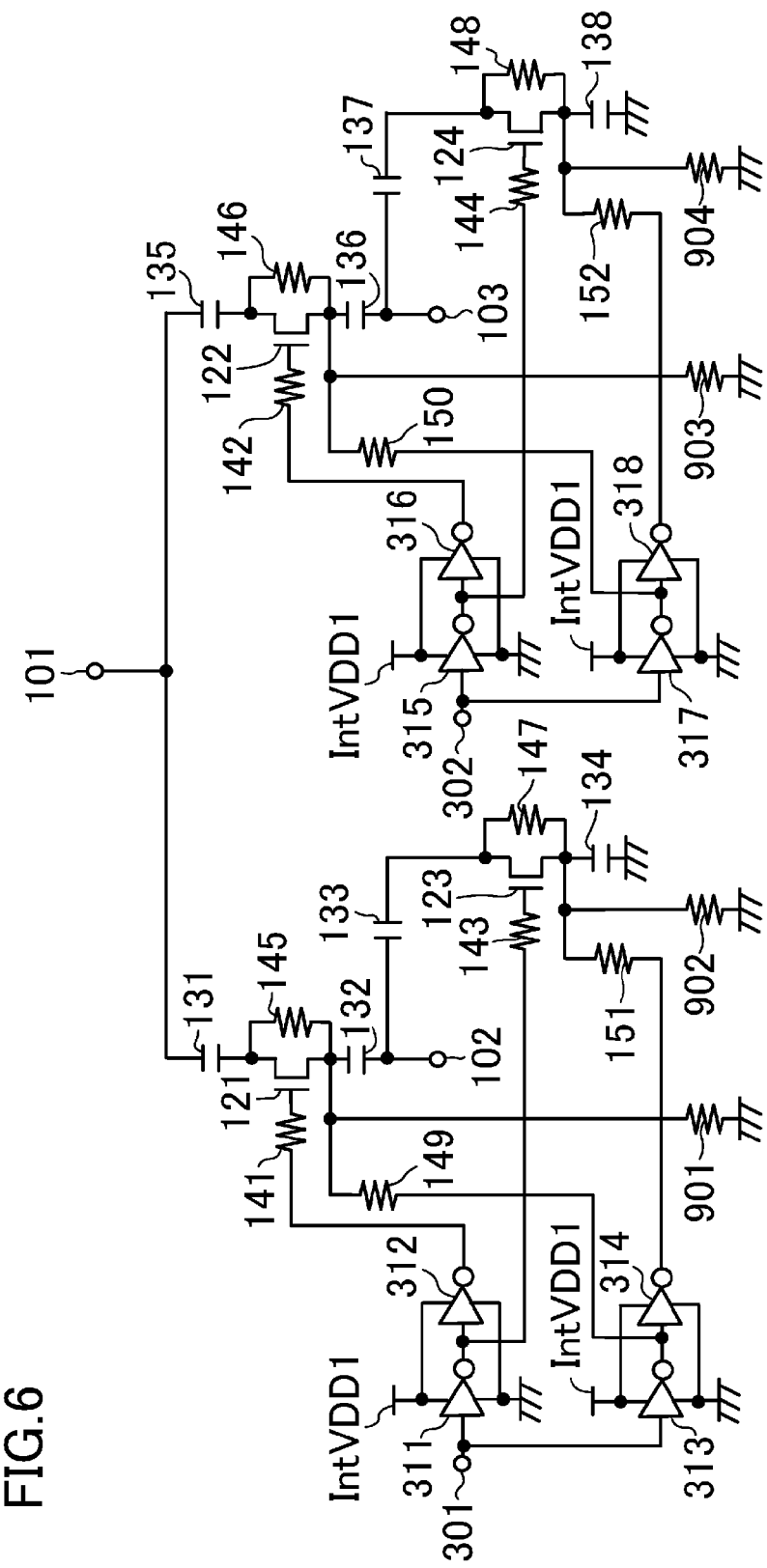
FIG. 6 is a circuit diagram showing an example configuration of a high-frequency semiconductor switch circuit according to a second embodiment of the present disclosure.

FIG. 6 is a circuit diagram showing an example configuration of a high-frequency semiconductor switch circuit according to a second embodiment of the present disclosure.

The high-frequency semiconductor switch circuit of FIG. 6 includes a common input/output terminal 101, separate input/output terminals 102 and 103, path switching FETs 121 and 122, shunt FETs 123 and 124, gate bias resistors 141-144, source-drain short-circuit resistors 145-148, source bias resistors 149-152, direct-current blocking capacitors 131-138, and inverter circuits 311-318. These parts are the same as those of the high-frequency semiconductor switch circuit of FIG. 1. Although, in FIG. 1, the power supply terminals of the inverter circuits 311, 312, 315, and 316 are connected to IntVDD1, and the power supply terminals of the inverter circuits 313, 314, 317, and 318 are connected to IntVDD2, all the power supply terminals of the inverter circuits 311-318 are connected to IntVDD1 in FIG. 6. Also, a voltage division resistor 901 is connected between a connection point between the source bias resistor 149 and the source terminal of the path switching FET 121, and the ground. A voltage division resistor 902 is connected between a connection point between the source bias resistor 151 and the source terminal of the shunt FET 123, and the ground. A voltage division resistor 903 is connected between a connection point between the source bias resistor 150 and the source terminal of the path switching FET 122, and the ground. A voltage division resistor 904 is connected between a connection point between the source bias resistor 152 and the source terminal of the shunt FET 124, and the ground.

By dividing the output voltage of the inverter circuit 313 using the source bias resistor 149 and the voltage division resistor 901, a voltage applied to the source of the path switching FET 121 can be caused to be lower than IntVDD1. By dividing the output voltage of the inverter circuit 314 using the source bias resistor 151 and the voltage division resistor 902, a voltage applied to the source of the shunt FET 123 can be caused to be lower than IntVDD1. By dividing the output voltage of the inverter circuit 317 using the source bias resistor 150 and the voltage division resistor 903, a voltage applied to the source of the path switching FET 122 can be caused to be lower than IntVDD1. By dividing the output voltage of the inverter circuit 318 using the source bias resistor 152 and the voltage division resistor 904, a voltage applied to the source of the shunt FET 124 can be caused to be lower than IntVDD1. Thus, even when a large amplitude signal is input to the common input/output terminal 101 (e.g., 2 Vpp), a FET in the off state can be controlled within an optimum operation range, and the breakdown voltage is not exceeded.

An example operation of the high-frequency semiconductor switch circuit of FIG. 6 in a case where at least one of the two paths is caused to be in the conducting state, will be described. Also, here, it is assumed that the high-frequency signal path between the common input/output terminal 101 and the separate input/output terminal 102 is caused to be in the conducting state, and the high-frequency signal path between the common input/output terminal 101 and the separate input/output terminal 103 is caused to be in the non-conducting state. In other words, the control terminal 301 is at the high level, and the control terminal 302 is at the low level. In this case, the gate voltage of the path switching FET 121 is at the high level, e.g., 2.5 V, and the source and drain voltages of the path switching FET 121 have a value which is obtained by dividing the low-level voltage using the source bias resistor 149 and the voltage division resistor 901, e.g., 0 V, so that the path switching FET 121 is in the on state. The gate voltage of the path switching FET 122 is at the low level, e.g., 0 V, and the source and drain voltages of the path switching FET 122 have a value which is obtained by dividing the high-level voltage using the source bias resistor 150 and the voltage division resistor 903, e.g., 1.25 V, so that the path switching FET 122 is in the off state. The gate voltage of the shunt FET 123 is at the low level, e.g., 0 V, and the source and drain voltages of the shunt FET 123 have a value which is obtained by dividing the high-level voltage using the source bias resistor 151 and the voltage division resistor 902, e.g., 1.25 V, so that the shunt FET 123 is in the off state. The gate voltage of the shunt FET 124 is at the high level, e.g., 2.5 V, and the source and drain voltages of the shunt FET 124 have a value which is obtained by dividing the low-level voltage using the source bias resistor 152 and the voltage division resistor 904, e.g., 0 V, so that the shunt FET 124 is in the on state. As a result, a signal is transmitted from the common input/output terminal 101 to the separate input/output terminal 102, and a signal is not transmitted from the common input/output terminal 101 to the separate input/output terminal 103. Thus, an on/off control can be reliably performed, and therefore, leakage to a signal path in the off state is reduced, whereby a high-frequency semiconductor switch circuit having good characteristics, such as high isolation and low distortion, can be provided.

Also, the source and drain voltages of the path switching FET 122 and the shunt FET 123 in the off state are caused to be at the mid-level obtained by voltage division using resistors, whereby even when a large amplitude signal is input to the common input/output terminal 101, the breakdown voltages of the path switching FET 122 and the shunt FET 123 are not exceeded. Specifically, when a high-frequency signal of 2 Vpp (the absolute values of the highest and lowest amplitudes are both 1 V) is input to the common input/output terminal 101, the maximum voltages applied to the sources of the path switching FET 122 and the shunt FET 123 are 1.25 V+1 V. When the breakdown voltages of the path switching FET 122 and the shunt FET 123 are, for example, 2.7 V, these breakdown voltages are not exceeded, and therefore, the FETs 122 and 123 operate normally.

As described above, according to the second embodiment, advantages similar to those of the first embodiment can be achieved. In addition, also in the second embodiment, variations substantially similar to those of the first embodiment can be provided. For example, the configuration of FIG. 6 may be changed to a high-frequency semiconductor switch circuit having three or more separate input/output terminals. This embodiment is also applicable to a case where a shunt FET block is connected only to a particular high-frequency signal path. This embodiment is also applicable to a case where the number of FETs connected together in series which are included in a FET block in each high-frequency signal path is two or more.

Note that a semiconductor substrate on which the high-frequency semiconductor switch circuits according to the first and second embodiments are formed may be an SOI substrate or an SOS substrate.

Third Embodiment

Figure 7:
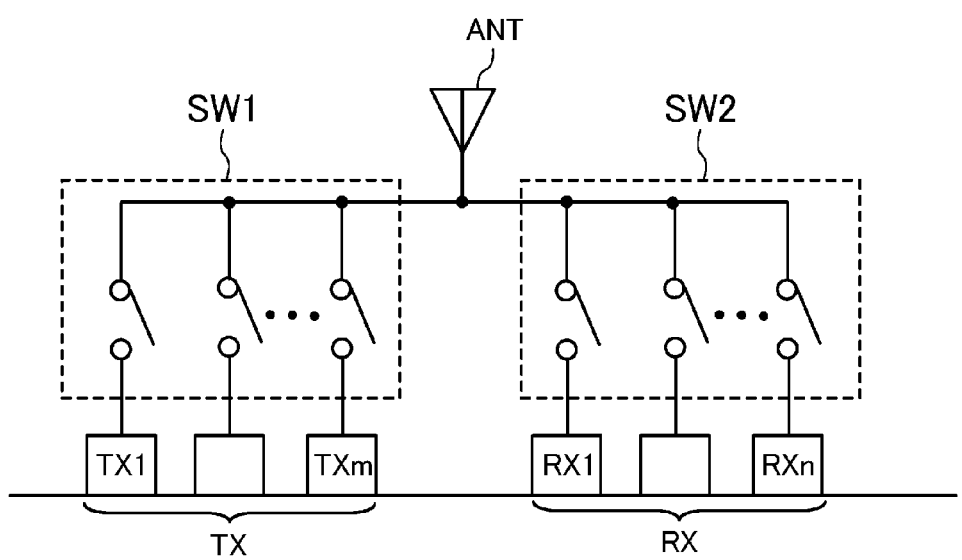
FIG. 7 is a schematic diagram showing an example configuration of a high-frequency radio system according to a third embodiment of the present disclosure which includes a high-frequency semiconductor switch circuit according to the present disclosure.

FIG. 7 is a schematic diagram showing an example configuration of a high-frequency radio system according to a third embodiment of the present disclosure. The high-frequency radio system of FIG. 7 is a system which switches an antenna ANT between transmission and reception and deals with two or more high-frequency powers having different magnitudes in, for example, a quasi-microwave band mobile communication apparatus. A transmitter TX includes m transmitter circuits TX1-TXm, and a receiver RX includes n receiver circuits RX1-RXn, where m and n are each an integer. A reference character SW1 indicates a transmitter switch circuit, and a reference character SW2 indicates a receiver switch circuit. For example, in the above first and second embodiments, the high-frequency semiconductor switch circuit described with reference to FIGS. 1, 4, 5, and 6 corresponds to a high-frequency semiconductor switch circuit including the transmitter switch circuit SW1 connected to the transmitter circuit TX1 and the receiver switch circuit SW2 connected to the receiver circuit RX1 in FIG. 7.

Note that when a MOSFET in the high-frequency signal path deals with large power, distortion is likely to occur in the MOSFET in the non-conducting state. Therefore, a plurality of MOSFETs are connected together in series to form cascade connection, so that a high-frequency signal having large power can be actively dealt with.

When the receiver switch circuit SW2 has a plurality of high-frequency signal paths, each path switching FET block may be configured to include a series circuit including a plurality of MOSFETs (see FIG. 5), and a portion of the MOSFETs may be shared by the path switching FET blocks. As a result, a smaller-size antenna switch circuit which has distortion characteristic similar to those of the conventional art can be provided.

The high-frequency semiconductor switch circuit of the present disclosure is useful for high-frequency radio systems which require a small size, light weight, and low power consumption, such as a mobile telephone, etc.

What is claimed is:

1. A high-frequency semiconductor switch circuit comprising:
    one common input/output terminal, two or more separate input/output terminals, and two or more control terminals corresponding to the separate input/output terminals;
    two or more path switching FET blocks, one block being provided between the common input/output terminal and each of the two or more separate input/output terminals;
    one or more shunt FET blocks, one block being provided between the ground and each of at least one of the two or more separate input/output terminals;
    a direct-current blocking capacitor provided at both ends of each of the two or more path switching FET blocks;
    a direct-current blocking capacitor provided at both ends of each of the one or more shunt FET blocks; and
    a source bias resistor provided for each of the two or more path switching FET blocks and for each of the one or more shunt FET blocks,
wherein
    a control voltage input to each of the two or more control terminals is applied to the gate of a corresponding one of the two or more path switching FET blocks so that at least one of high-frequency signal paths between the common input/output terminal and the respective separate input/output terminals is caused to be in the conducting state while the other high-frequency signal paths are caused to be in the non-conducting state,
    a control voltage which is an inverted version of a voltage input to each of the two or more control terminals is applied to the gate of a corresponding one of the one or more shunt FET blocks,
    a control voltage which has an inverted polarity and a smaller absolute value compared to a voltage input to each of the two or more control terminals, is applied to the source or drain of a corresponding one of the two or more path switching FET blocks, and
    a control voltage which has a non-inverted polarity and a smaller absolute value compared to a voltage input to each of the two or more control terminals, is applied to the source or drain of a corresponding one of the one or more shunt FET blocks.

2. The high-frequency semiconductor switch circuit of claim 1, further comprising:
    an inverter circuit configured to have a first internal power supply voltage as a power supply voltage; and
    an inverter circuit configured to have a second internal power supply voltage having a value smaller than that of the first internal power supply voltage as a power supply voltage, wherein
    a control voltage input to each of the two or more control terminals is applied to the gate of a corresponding one of the two or more path switching FET blocks, through a cascade of two inverter circuits having the first internal power supply voltage as a power supply voltage or a circuit having the same logic as that of the cascade of two inverter circuits, so that at least one of high-frequency signal paths between the common input/output terminal and the respective separate input/output terminals is caused to be in the conducting state while the other high-frequency signal paths are caused to be in the non-conducting state,
    a control voltage input to each of the two or more control terminals is applied to the gate of a corresponding one of the one or more shunt FET blocks through a single inverter circuit having the first internal power supply voltage as a power supply voltage or a circuit having the same logic as that of the single inverter circuit,
    a control voltage input to each of the two or more control terminals is applied to the source of a corresponding one of the two or more path switching FET blocks through a single inverter circuit having the second internal power supply voltage as a power supply voltage or a circuit having the same logic as that of the single inverter circuit, and
    a control voltage input to each of the two or more control terminals is applied to the source of a corresponding one of the one or more shunt FET blocks through a cascade of two inverter circuits having the second internal power supply voltage as a power supply voltage or a circuit having the same logic as that of the cascade of two inverter circuits.

3. The high-frequency semiconductor switch circuit of claim 1, further comprising:
    an inverter circuit; and
    a voltage division resistor,
wherein
    a control voltage input to each of the two or more control terminals is applied to the gate of a corresponding one of the two or more path switching FET blocks, through a cascade of two inverter circuits or a circuit having the same logic as that of the cascade of two inverter circuits, so that at least one of high-frequency signal paths between the common input/output terminal and the respective separate input/output terminals is caused to be in the conducting state while the other high-frequency signal paths are caused to be in the non-conducting state,
    a control voltage input to each of the two or more control terminals is applied to the gate of a corresponding one of the one or more shunt FET blocks through a single inverter circuit or a circuit having the same logic as that of the single inverter circuit,
    a control voltage input to each of the two or more control terminals is passed through a single inverter circuit or a circuit having the same logic as that of the single inverter circuit, and divided using the voltage division resistor, to obtain a division control voltage, and the division control voltage is applied to the source of a corresponding one of the two or more path switching FET blocks, and a control voltage input to each of the two or more control terminals is passed through a cascade of two inverter circuits or a circuit having the same logic as that of the cascade of two inverter circuits, and divided using the voltage division resistor, to obtain a division control voltage, and the division control voltage is applied to the source of a corresponding one of the one or more shunt FET blocks.

4. The high-frequency semiconductor switch circuit of claim 1, wherein the semiconductor substrate is an SOI substrate or an SOS substrate.

5. The high-frequency semiconductor switch circuit of claim 1, wherein the two or more path switching FET blocks each include a plurality of MOSFET connected together in series.

6. The high-frequency semiconductor switch circuit of claim 1, wherein the one or more shunt FET blocks each include a plurality of MOSFET connected together in series.

7. A high-frequency radio system comprising:

the high-frequency semiconductor switch circuit of claim 1.

* * * * *